United States Patent
Kuo et al.

(10) Patent No.: US 9,972,509 B2
(45) Date of Patent: May 15, 2018

(54) ANTI-PLASMA ADHESIVE TAPE AND MANUFACTURING METHOD

(71) Applicant: WIN Semiconductors Corp., Tao Yuan (TW)

(72) Inventors: Chih-Hsiang Kuo, New Taipei (TW); Chih-Wen Huang, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days. days.

(21) Appl. No.: 15/262,020

(22) Filed: Sep. 12, 2016

(65) Prior Publication Data

US 2018/0076054 A1   Mar. 15, 2018

(51) Int. Cl.
| H01L 21/56 | (2006.01) |
| H01L 23/498 | (2006.01) |
| H01L 21/683 | (2006.01) |
| H01L 21/02 | (2006.01) |

(52) U.S. Cl.
CPC ...... *H01L 21/568* (2013.01); *H01L 21/02076* (2013.01); *H01L 21/6835* (2013.01); *H01L 23/49805* (2013.01); *H01L 2221/68318* (2013.01); *H01L 2221/68381* (2013.01)

(58) Field of Classification Search
CPC ....... H01L 2924/00014; H01L 2924/00; H01L 2224/73265; H01L 2224/48247; H01L 2224/97
See application file for complete search history.

(56) References Cited

U.S. PATENT DOCUMENTS

| 2005/0158009 A1* | 7/2005 | Eichelberger | ........... H01L 21/56 385/147 |
| 2011/0111563 A1* | 5/2011 | Yanagi | .................. H01L 21/561 438/118 |
| 2011/0318580 A1 | 12/2011 | Choi | |

FOREIGN PATENT DOCUMENTS

| TW | 201033317 A1 | 9/2010 |
| TW | 201125083 A1 | 7/2011 |
| TW | 201350557 A | 12/2013 |
| TW | 201540803 A | 11/2015 |

\* cited by examiner

*Primary Examiner* — Tony Tran
(74) *Attorney, Agent, or Firm* — Winston Hsu

(57) ABSTRACT

An anti-plasma adhesive tape utilized for manufacturing a semiconductor package includes a substrate; and an adhesive layer formed on the substrate, wherein the adhesive layer is selected from a group composed of acrylic adhesive, light-curable resin and photoinitiator. The anti-plasma adhesive tape is attached to a backside of a lead frame of the semiconductor package before a plasma-cleaning process and removed from the lead frame after a molding process. After the anti-plasma adhesive tape is cured by irradiating an energy ray and removed from the lead frame, there is no residual adhesive left on a molding compound of the semiconductor package.

4 Claims, 5 Drawing Sheets

ANTI-PLASMA ADHESIVE TAPE AND MANUFACTURING METHOD

BACKGROUND OF THE INVENTION

1. Field of the Invention

The present invention relates to an anti-plasma adhesive tape and a manufacturing method, and more particularly, to an anti-plasma adhesive tape and a manufacturing method utilized for manufacturing a semiconductor package, capable of leaving no residual adhesive on a molding compound of the semiconductor package.

2. Description of the Prior Art

In general, a quad flat no lead package (QFN) semiconductor is made by a method of manufacturing in which a lead frame is equipped in a package. There is a known method of manufacturing QFN described in the following. In a taping process, an adhesive tape is attached to a backside of a lead frame. In a plasma-cleaning process, the lead frame is cleaned by plasma gas. In a die/wire bonding process, dies are mounted on a top-side of the lead frame, and electric connection is carried out by bonding a plurality of leads and the dies with wires. In a molding process, the lead frame and the semiconductor elements mounted on the lead frame are sealed with molding compound (e.g., epoxy resin). Finally, in a de-taping process, the adhesive tape is released/removed from the lead frame.

Nevertheless, during the plasma-cleaning process, the traditional adhesive tape would have reactions (physical or chemical reactions) with the plasma gas, i.e., the adhesive tape may be eroded by the plasma gas, such that material characteristic of the adhesive tape would vary because of the plasma gas. An adhesiveness between the adhesive tape and the molding compound increases, resulting in that after the de-taping process, residual adhesive would be left on the molding compound.

Specifically, please refer to FIG. 10, which illustrates a sectional side view of a semiconductor package 12 performing the de-taping process. The semiconductor package 12 comprises a lead frame LF', a die DE', bonding wires WR', and a molding compound MC', where the lead frame LF' comprises a die pad PD' and leads LD'. As FIG. 10 shows, once a traditional adhesive tape AHV is removed/released from the lead frame LF' during the de-taping process, a residual adhesive RA is left on the molding compound MC'.

The residual adhesive would have negative impact on the following-up process of the semiconductor package (e.g., testing of the semiconductor package). It requires an additional cleaning process (e.g., a waterjet cleaning process or a detergent cleaning process) to clean out the residual adhesive, which increases an extra cost of manufacturing the semiconductor package.

Therefore, how to avoid the residual adhesive on the molding compound without causing extra cost is a significant objective in the field.

SUMMARY OF THE INVENTION

It is therefore a primary objective of the present invention to provide an anti-plasma adhesive tape and a manufacturing method, capable of leaving no residual adhesive on a molding compound of the semiconductor package, to improve over disadvantages of the prior art.

An embodiment of the present invention discloses an anti-plasma adhesive tape utilized for manufacturing a semiconductor package. The anti-plasma adhesive tape is attached to a backside of a lead frame of the semiconductor package before a plasma-cleaning process and removed from the lead frame after a molding process. The anti-plasma adhesive tape comprises a substrate; and an adhesive layer formed on the substrate, wherein the adhesive layer is selected from a group composed of acrylic adhesive, light-curable resin and photoinitiator. After the anti-plasma adhesive tape is cured by irradiating an energy ray and removed from the lead frame, there is no residual adhesive left on a molding compound of the semiconductor package.

An embodiment of the present invention further discloses a manufacturing method of a semiconductor package. The method comprises steps of attaching an anti-plasma adhesive tape to a first side of lead frame; mounting a die on a second side of the lead frame; curing the anti-plasma adhesive tape by irradiating an energy ray toward the anti-plasma adhesive tape; cleaning the die and the lead frame using a plasma gas after curing the parts of the anti-plasma adhesive tape; performing a molding process on the die and the lead frame; and removing the anti-plasma adhesive tape after the lead frame is sealed with the molding compound.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
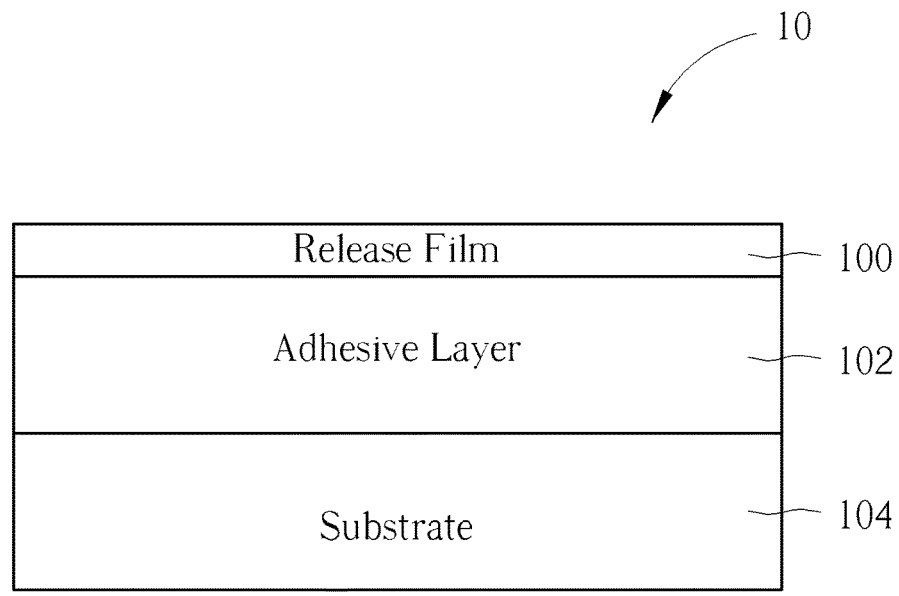
FIG. 1 is a schematic diagram of an anti-plasma adhesive tape according to an embodiment of the present invention.

Please refer to FIG. 1, which is a schematic diagram of an anti-plasma adhesive tape 10 according to an embodiment of the present invention. The anti-plasma adhesive tape 10 is utilized for manufacturing a semiconductor package comprising a lead frame, e.g., a quad flat no lead package (QFN). The anti-plasma adhesive tape 10 is attached to a backside of the lead frame of the semiconductor package before a molding process of manufacturing the semiconductor package and removed from the lead frame after the molding process, so as to prevent a molding compound from leaking to the backside of the lead frame. Notably, the semiconductor package has to be cleaned using a plasma gas (via a plasma cleaning process) before the molding process. The anti-plasma adhesive tape 10 is capable of being free from residual adhesive caused by the plasma cleaning process, so as to have a better quality of the manufactured semiconductor package.

The anti-plasma adhesive tape 10 comprises a release film 100, an adhesive layer 102 and a substrate 104. The release film 100 is on the adhesive layer 102, and removed/released before the anti-plasma adhesive tape 10 is attached to the lead frame. The adhesive layer 102, formed on the substrate 104, is made of a light-curable material which is selected from a group composed of acrylic adhesive, light-curable resin and photoinitiator. The light-curable resin may be ultraviolet (UV) curable resin. Composition ratios corresponding to the adhesive layer 102 of ingredients by weight percentage of each component are: acrylic adhesive is 50-95%, light-curable resin is 1-30%, and photoinitiator is 1-30%. The adhesive layer 102 may be cured by irradiating an energy ray before the plasma-cleaning process, where the energy ray may be UV, or a wavelength of the energy ray is between 200-450 nanometers (nm). The cured adhesive layer would hardly have reactions with the plasma gas, and an adhesiveness between the adhesive layer 102 and the molding compound is insufficient. Therefore, when the adhesive layer 102 is released/removed from the lead frame, there is no residual adhesive left on the molding compound of the semiconductor package.

Figure 2:
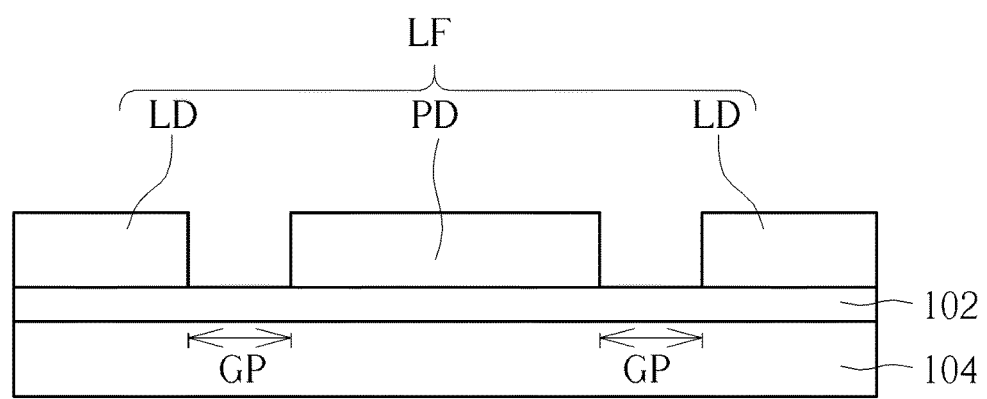
FIGS. 2-9 illustrate a process of manufacturing the semiconductor package.
Figure 3:
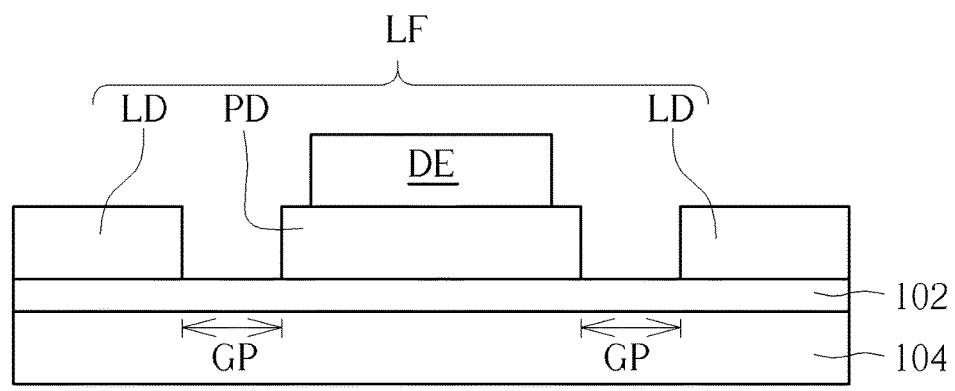

Specifically, please refer to FIGS. 2-9, which illustrate a process of manufacturing the semiconductor package. Referring to FIG. 2, in which a taping process is performed. The release film 100 is removed/released before the anti-plasma adhesive tape 10 is attached to a lead frame LF. The lead frame LF comprises a die pad PD and leads LD. Except the release film 100, the adhesive layer 102 and the substrate 104 are attached to a backside of the lead frame LF, i.e., attached to a backside of the leads LD and the die pad PD. Gaps GP are denoted as gaps between the leads LD and the die pad PD. Referring to FIG. 3, in which a die bonding process is performed, a die DE is mounted on a top-side of the die pad PD of the lead frame LF.

Figure 4:
Figure 4:
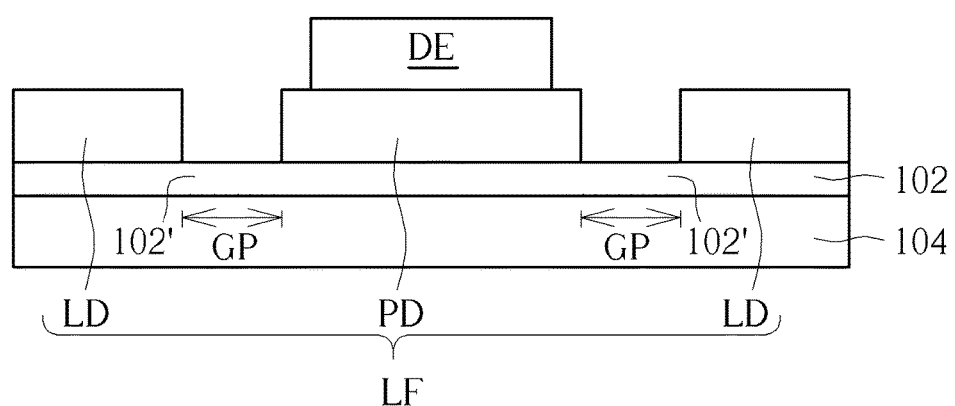
Figure 5:
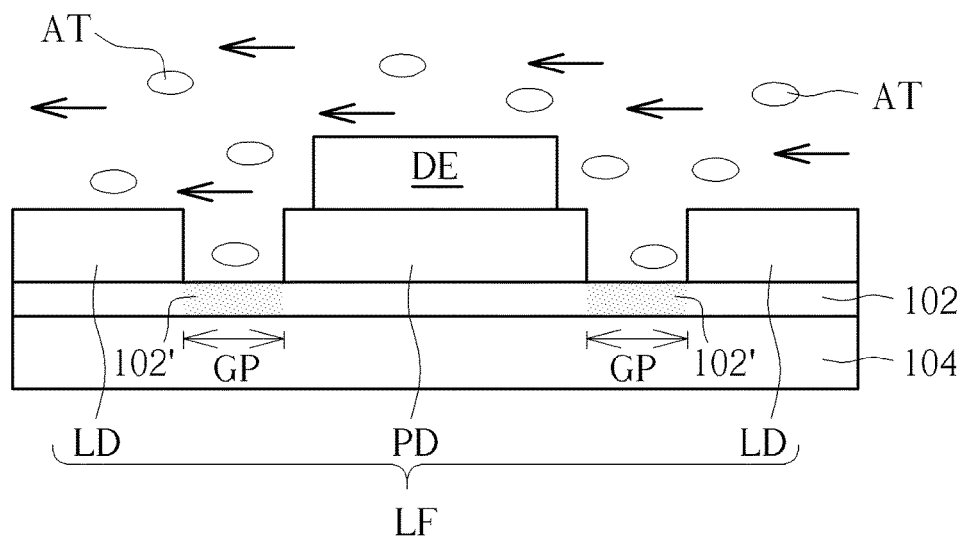

Referring to FIG. 4, in which a curing process is performed. Part of the adhesive layer 102, within the gaps GP between the leads LD and the die pad PD, is irradiated by UV and cured, such that cured adhesive layers 102' is formed within the gaps GP between the leads LD and the die pad PD. Referring to FIG. 5, in which a plasma-cleaning process is performed. Dust or particles on the die DE and the lead frame LF are cleaned by molecules or atoms AT of the plasma gas, where AT denotes the molecules or atoms of the plasma gas, and the plasma gas may be Oxygen ($O_2$), Argon (Ar), Hydrogen ($H_2$), or a mixture thereof. As performing the plasma-cleaning process, only the cured adhesive layers 102' would have contact with the plasma gas (which means that the rest of the adhesive layer 102 except the cured adhesive layers 102' would not have contact with the plasma gas). Notably, the cured adhesive layers 102' would hardly have reactions with the plasma gas.

Figure 6:
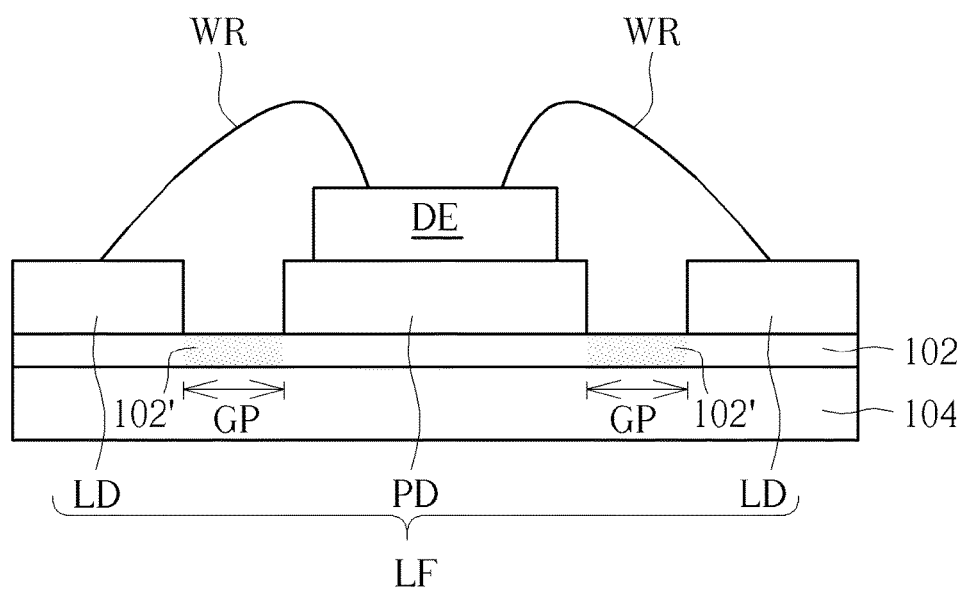
Figure 7:
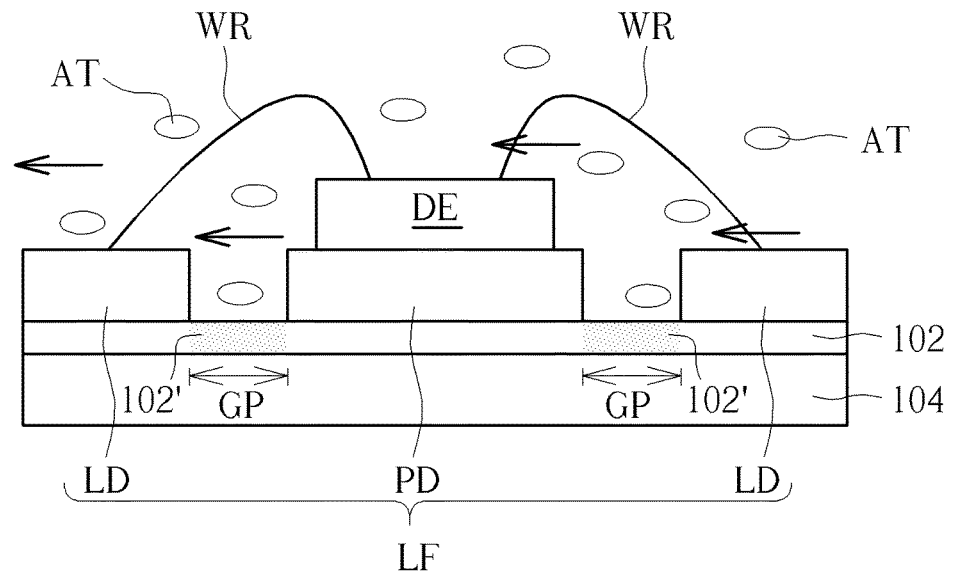

Referring to FIG. 6, in which a wire bonding process is performed. The wires WR are bonded between the die DE and the leads LD, establishing connects between the die DE and the leads LD. Referring to FIG. 7, in which the plasma-cleaning process is performed again. Similarly, dust or particles on the die DE, the lead frame LF and the bonding wires WR are rinsed/cleaned by the molecules or atoms AT of the plasma gas. Again, the cured adhesive layers 102' would hardly have reactions with the plasma gas.

Figure 8:
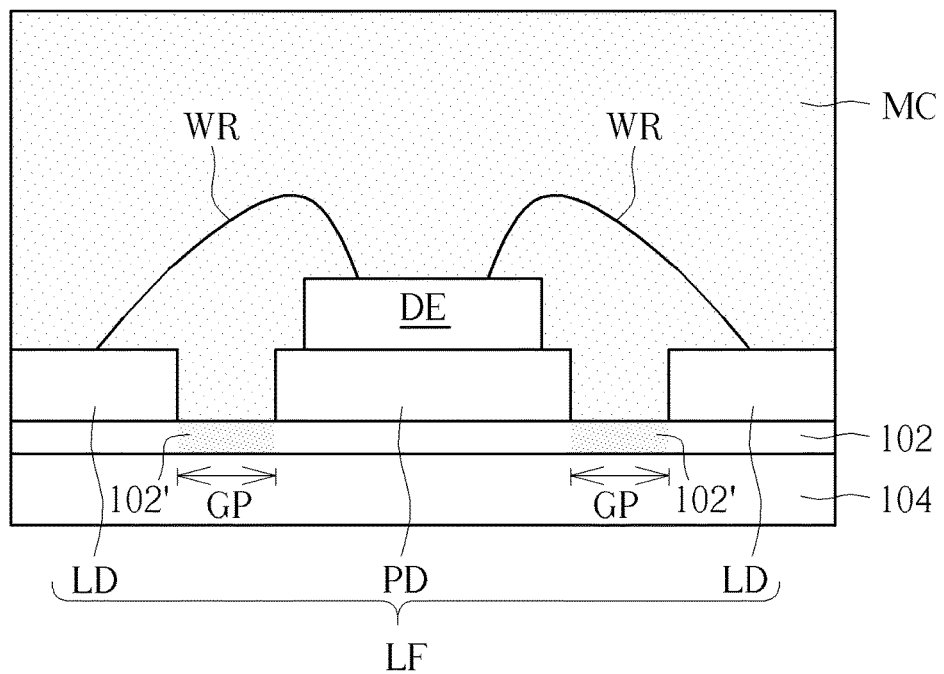
Figure 9:
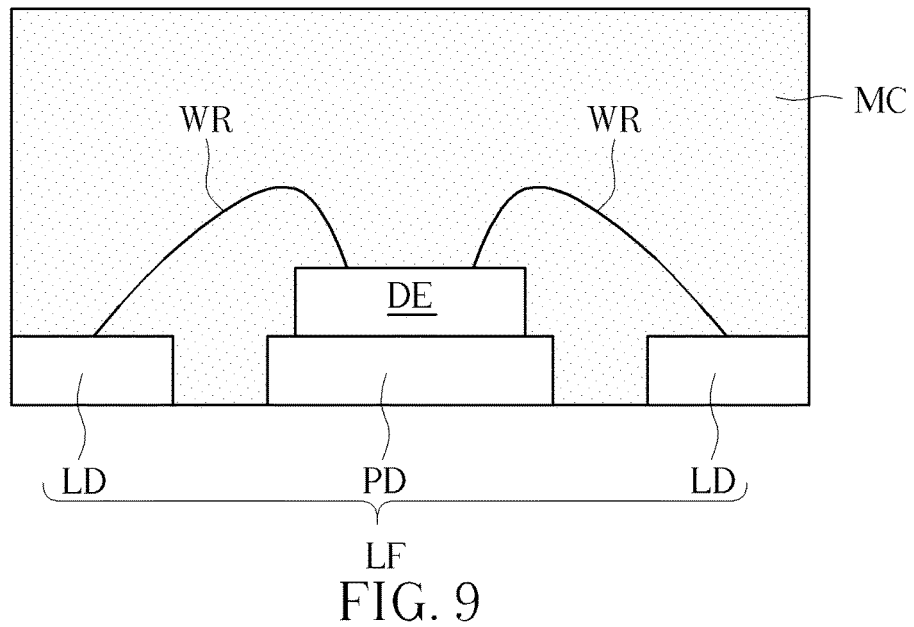
Figure 10:
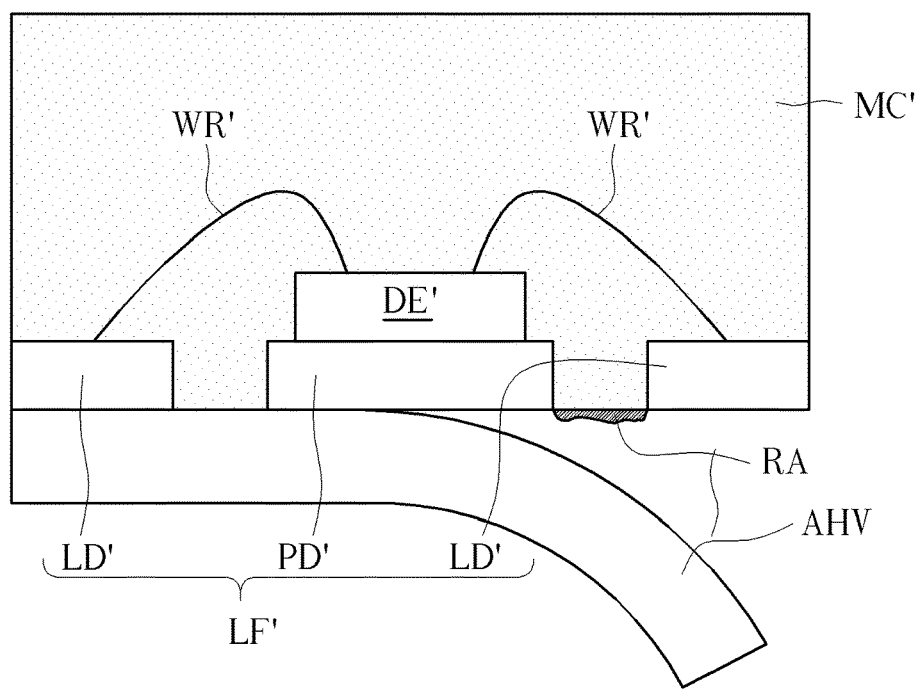
FIG. 10 illustrates a sectional side view of a semiconductor package performing a de-taping process.

Referring to FIG. 8, in which a molding process is performed. The die DE, the bonding wires WR and the lead frame LF are sealed with molding compound MC, where the molding compound MC may be epoxy resin. The molding compound MC would be blocked by the anti-plasma adhesive tape 10 (except the release film 100) and would not leak to the backside of the lead frame. Referring to FIG. 9, in which a de-taping process is performed. The adhesive layer 102 and the substrate 104 of the anti-plasma adhesive tape 10 are removed.

Notably, since the cured adhesive layers 102' would hardly have reactions with the plasma gas, an adhesiveness between the cured adhesive layers 102' and the molding compound MC is significantly reduced and insufficient. Thus, after the anti-plasma adhesive tape 10 is removed, there is no residual adhesive left on the molding compound MC of the semiconductor package. In addition, the anti-plasma adhesive tape 10 is customized for the manufacturing process including the plasma cleaning process. Without the plasma cleaning process, there is no residual adhesive. Compared to the prior art in which the plasma cleaning process is employed, since there is no residual adhesive left on the molding compound MC, there is no need to perform a waterjet cleaning process or a detergent cleaning process to clean out/eliminate the residual adhesive. Hence, a production cost of manufacturing the semiconductor package is reduced.

Notably, the embodiments stated in the above are utilized for illustrating the concept of the present invention. Those skilled in the art may make modifications and alterations accordingly, and not limited herein. For example, the curing process is not limited to be performed after the die bonding process. The curing process may be performed before the die bonding process. As long as the part of the adhesive layer 102 within the gaps GP between the leads LD and the die pad PD is cured (i.e., the curing process is performed) before the plasma-cleaning process, requirements of the present invention are satisfied, which is within the scope of the present invention.

In summary, the present invention utilizes the light-curable material (e.g., acrylic adhesive and/or light-curable resin) to form the adhesive layer of the anti-plasma adhesive tape, to prevent erosion of the adhesive layer caused by the plasma gas. Hence, as the anti-plasma adhesive tape is removed, there is no residual adhesive left on the molding compound of the semiconductor package, and no need for further waterjet cleaning or detergent cleaning accordingly. The production cost of manufacturing the semiconductor package is therefore reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor package, the method comprising:

attaching an anti-plasma adhesive tape to a first side of a lead frame, wherein the anti-plasma adhesive tape comprises an adhesive layer, the lead frame comprises a die pad and leads, and gaps are formed between the die pad and the leads;

mounting a die on a second side of the lead frame;

curing a first part of the adhesive layer directly under the gaps by irradiating an energy ray toward a second side of the lead frame, wherein a second part of the adhesive layer which is directly under the lead frame is not cured, and the second side of the lead frame is opposite to the first side of the lead frame;

cleaning the die and the lead frame using a plasma gas after curing the parts of the anti-plasma adhesive tape and before a molding process, wherein cleaning the die and the lead frame using the plasma gas is configured to clean dust or particles on the lead frame;

performing the molding process on the die and the lead frame; and removing the anti-plasma adhesive tape after the lead frame is sealed with the molding compound after the molding process, wherein right after the anti-plasma adhesive tape is removed from the lead frame, there is no residual adhesive left on a molding compound of the semiconductor package and no cleaning process is required to clean out the residual adhesive;

wherein the adhesive layer comprises a light-curable material, the light-curable material is selected from a group composed of acrylic adhesive, light-curable resin and photoinitiator;

wherein the light-curable resin is ultraviolet curable resin; and wherein composition ratios corresponding to the adhesive layer of ingredients by weight percentage of each component are as follows: acrylic adhesive is 50-95%, light-curable resin is 1-30%, and photoinitiator is 1-30%.

2. The manufacturing method of claim 1, further comprising:

curing the anti-plasma adhesive tape by irradiating an energy ray toward the anti-plasma adhesive tape.

3. The manufacturing method of claim 2, wherein the energy ray is ultraviolet.

4. The manufacturing method of claim 1, wherein the plasma gas is selected from a group composed of Oxygen ($O_2$), Argon (Ar) and Hydrogen ($H_2$).

* * * * *